US012607794B2

(12) United States Patent (10) Patent No.: US 12,607,794 B2
Wang et al. (45) Date of Patent: Apr. 21, 2026

(54) POLARIZATION FILTER FOR AUTOFOCUS PIXEL STRUCTURES HAVING SYMMETRIC APERTURES

(71) Applicant: OMNIVISION TECHNOLOGIES, INC., Santa Clara, CA (US)

(72) Inventors: Qin Wang, San Jose, CA (US); Chin Poh Pang, Pleasanton, CA (US); Gang Chen, San Jose, CA (US)

(73) Assignee: OMNIVISION TECHNOLOGIES, INC., Santa Clara, CA (US)

( * ) Notice: Subject to any disclaimer, the term of this patent is extended or adjusted under 35 U.S.C. 154(b) by 966 days.

(21) Appl. No.: 17/713,593

(22) Filed: Apr. 5, 2022

(65) Prior Publication Data

US 2023/0314681 A1      Oct. 5, 2023

(51) Int. Cl.
| | |
|---|---|
| *G02B 5/20* | (2006.01) |
| *G02B 5/30* | (2006.01) |
| *G02B 27/28* | (2006.01) |
| *H10F 39/00* | (2025.01) |
| *H10F 39/18* | (2025.01) |

(52) U.S. Cl.
CPC ......... *G02B 5/3058* (2013.01); *G02B 27/288* (2013.01); *H10F 39/18* (2025.01); *H10F 39/8053* (2025.01); *H10F 39/8063* (2025.01)

(58) Field of Classification Search
CPC ......... G02B 5/20; G02B 5/30; G02B 5/3058; G02B 27/288; H10F 39/18; H10F 39/8053; H10F 39/8063
See application file for complete search history.

(56) References Cited

U.S. PATENT DOCUMENTS

| | | | |
|---|---|---|---|
| 8,698,217 B2 | 4/2014 | Hsu et al. | |
| 8,866,250 B2 | 10/2014 | Ting et al. | |
| 9,397,129 B2 | 7/2016 | Chien et al. | |
| 9,911,780 B1 | 3/2018 | Wang et al. | |
| 9,985,062 B2 | 5/2018 | Jung | |
| 11,474,334 B2* | 10/2022 | Fukazawa | G02B 27/288 |
| 2013/0293871 A1* | 11/2013 | Gruev | G01J 4/04 |
| | | | 356/73 |
| 2021/0104560 A1 | 4/2021 | Lee | |
| 2021/0265397 A1 | 8/2021 | Han et al. | |
| 2024/0247929 A1* | 7/2024 | Yang | G06F 1/1681 |

FOREIGN PATENT DOCUMENTS

| | | | | |
|---|---|---|---|---|
| EP | 2657652 A1 * | 10/2013 | ............ | G01D 5/285 |
| EP | 2908099 A1 * | 8/2015 | .......... | G01D 5/3473 |

OTHER PUBLICATIONS

English translation of Hopp EP 2657652 A1 (Year: 2013).*
English translation of Mutschler EP 2908099 A1 (Year: 2015).*

* cited by examiner

*Primary Examiner* — Ryan S Dunning
(74) *Attorney, Agent, or Firm* — Christensen O'Connor Johnson Kindness, PLLC

(57) ABSTRACT

Image sensors and devices for phase-detection auto focus processes are provided. A symmetric polarization filter includes a first polarizer defining a first plurality of apertures and a second polarizer adjacent with the first polarizer defining a second plurality of apertures. The first plurality of apertures can be mirror symmetrical with the second plurality of apertures about a lateral axis of the symmetric polarization filter between the first polarizer and the second polarizer. The lateral axis can be defined as an axis of symmetry of the symmetric polarization filter in plane with the first polarizer and the second polarizer.

21 Claims, 5 Drawing Sheets

100-AA'

100-BB'

POLARIZATION FILTER FOR AUTOFOCUS PIXEL STRUCTURES HAVING SYMMETRIC APERTURES

TECHNICAL FIELD

This disclosure relates generally to image sensors, and, in particular but not exclusively, relates to CMOS image sensors and applications thereof.

BACKGROUND INFORMATION

Image sensors have become ubiquitous and are now widely used in digital cameras, cellular phones, security cameras, as well as medical, automobile, and other applications. As image sensors are integrated into a broader range of electronic devices it is desirable to enhance their functionality, performance metrics, and the like in as many ways as possible (e.g., resolution, power consumption, dynamic range, etc.) through both device architecture design as well as image processing.

The typical image sensor operates in response to image light reflected from an external scene being incident upon the image sensor. The image sensor includes an array of pixels having photosensitive elements (e.g., photodiodes) that absorb a portion of the incident image light and generate image charge upon absorption of the image light. The image charge of each of the pixels may be measured as an output voltage of each photosensitive element that varies as a function of the incident image light. In other words, the amount of image charge generated is proportional to the intensity of the image light, which is utilized to produce a digital image (e.g., image data) representing the external scene.

BRIEF DESCRIPTION OF THE DRAWINGS

Non-limiting and non-exhaustive embodiments of the invention are described with reference to the following figures, wherein like reference numerals refer to like parts throughout the various views unless otherwise specified. Not all instances of an element are necessarily labeled so as not to clutter the drawings where appropriate. The drawings are not necessarily to scale, emphasis instead being placed upon illustrating the principles being described.

Figure 1A:
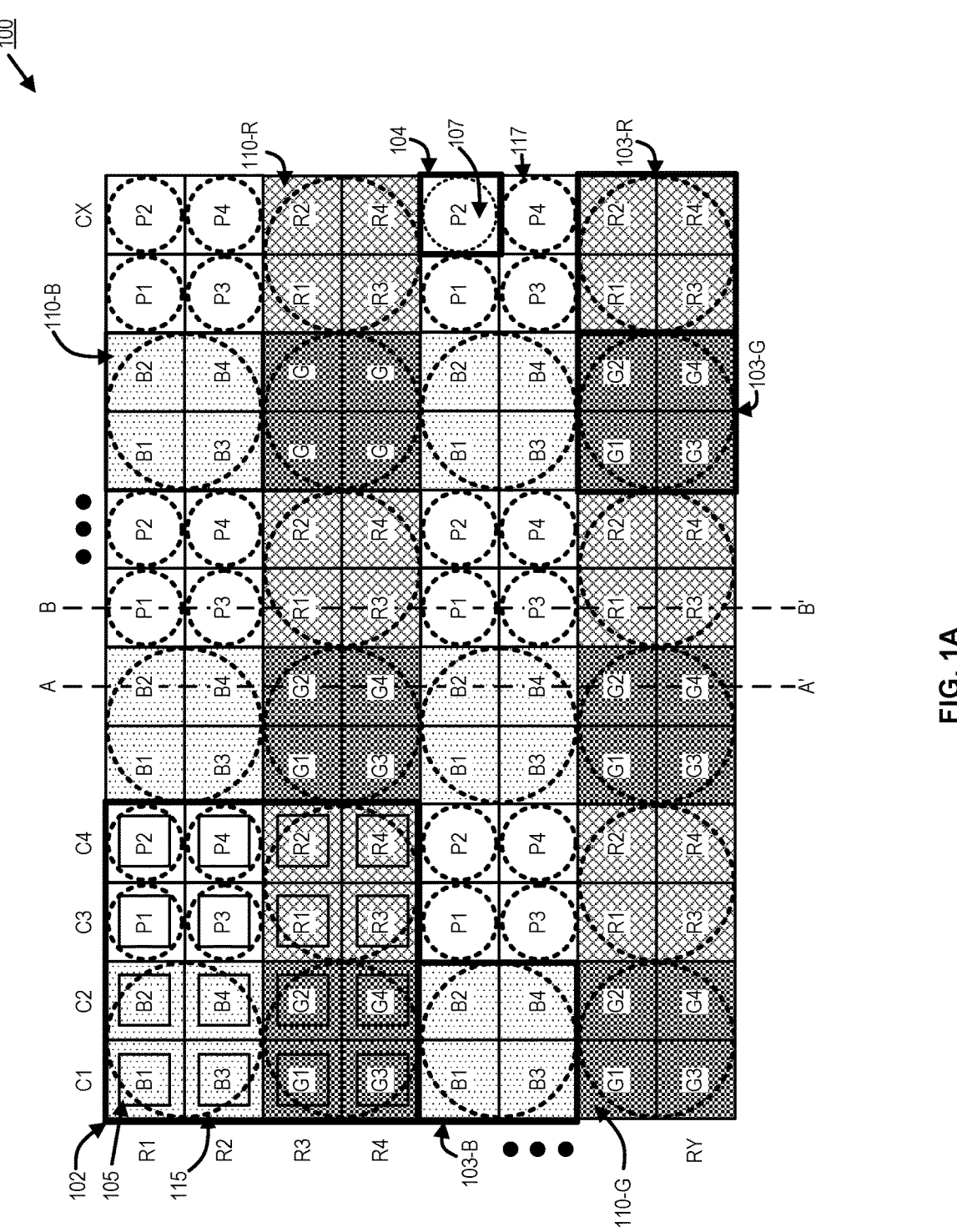
FIG. 1A illustrates a top view of a minimal repeat unit of an image sensor with a shared micro-lens and a polarization pixel, in accordance with embodiments of the present disclosure.

Corresponding reference characters indicate corresponding components throughout the several views of the drawings. Skilled artisans will appreciate that elements in the figures are illustrated for simplicity and clarity and have not necessarily been drawn to scale. For example, the dimensions of some of the elements in the figures can be exaggerated relative to other elements to help to improve understanding of various embodiments of the present invention. In addition, common but well-understood elements that are useful or necessary in a commercially feasible embodiment are often not depicted in order to facilitate a less obstructed view of these various embodiments of the present invention.

DETAILED DESCRIPTION

Embodiments of an apparatus, system, and method each including or otherwise related to an image sensor with symmetric polarization filters are described herein. In the following description, numerous specific details are set forth to provide a thorough understanding of the embodiments. One skilled in the relevant art will recognize, however, that the techniques described herein can be practiced without one or more of the specific details, or with other methods, components, materials, etc. In other instances, well-known structures, materials, or operations are not shown or described in detail to avoid obscuring certain aspects.

Advancements in semiconductor processing techniques have enabled the fabrication of complementary metal oxide semiconductor devices (e.g., image sensors, processors, displays, and the like) with increasingly smaller feature sizes, which has enabled miniaturization of many devices and incorporation of multiple sensor features in a single sensor array. For example, hybrid image sensors can include image pixel structures and polarization pixel structures to facilitate both image capture and auto-focus operations on a single sensor. However, polarization filters that are based on a conventional design, as described in more detail in reference to FIG. 2A, face several process and performance limitations. For example, the conventional polarizer configuration includes four different polarizer filters that are formed by distinct mask patterns that increase the complexity of fabrication. As another example, the conventional polarizer configuration typically blocks incident light in the central regions of the constituent photodiodes making up the polarization pixel, thereby reducing quantum efficiency of polarization pixel structures and impairing PDAF performance. There is a need, therefore, for improved polarizer configurations that address the drawbacks of conventional polarization pixel structures.

Embodiments described herein utilize an image sensor with an architecture that can include an improved polarization filter configuration to provide improved phase information of an external scene (e.g., for phase detection auto focus, depth mapping, and the like) relative to conventional polarizer arrangements. As such, the architecture of an image sensor can include a plurality of polarization pixels structures configured to provide surface normal angle information of the external scene. Advantageously, phase information provided by the plurality of subpixels can be combined with the surface normal angle information to provide depth mapping that is compatible for a wide variety of scenes. For example, the phase information from the plurality of subpixels can provide phase information or relative depth information of edges of the external scene that contrast one another (e.g., when transitioning to different objects of the external scene).

Embodiments of the present disclosure include symmetric polarization filter configurations based at least in part on consistent linear polarizer patterns for multi-directional phase detection auto focus (PDAF). The phase information can then be subsequently used in response to generate multi-directional guidance as to how an objective lens of an imaging system should be adjusted when the point of interest (POI) is out of focus. In contrast to conventional multi-polarizer configurations that include multiple different polarizer patterns with differing extinction ratios and performance characteristics, symmetric polarization filters of the present disclosure provide improved quantum efficiency, improved consistency of extinction ratio, and improved manufacturing performance.

FIGS. 1A-1D illustrate representative views of an image sensor 100. It is appreciated that the views presented in FIGS. 1A-1D can omit certain elements of image sensor 100 to avoid obscuring details of the disclosure. As such, some elements of image sensor 100 can be unlabeled or otherwise omitted in FIGS. 1A-1D. It is further appreciated that in some embodiments, image sensor 100 can omit elements shown in FIGS. 1A-1D.

FIG. 1A illustrates a top view 100-A of image sensor 100 with a shared micro-lens 115 and a polarization pixel 104, in accordance with embodiments of the present disclosure. Image sensor 100 includes an image pixel 102, which can be representative of any image pixel included in a plurality of image pixels that collectively form image sensor 100. Image pixel 102 can be a repeat unit of image sensor 100 and includes a plurality of subpixels 103 (e.g., a blue subpixel 103-B, a green subpixel 103-G, and a red subpixel 103-R) and a plurality of polarization pixels 104 (e.g., P1, P2, P3, and P4). In this context, the term "subpixel" refers to a grouping of pixels that together generate image data corresponding to the indicated color filter as part of a multi-color image pixel 102. The image sensor 100 includes, inter alia, a plurality of photodiodes 105 (e.g., B1, B2, B3, B4, G1, G2, G3, G4, R1, R2, R3, R4, P1, P2, P3, P4, and so on) arranged in rows (e.g., R1, R2, R3, RY) and columns (e.g., C1, C2, C3, CX) as a photodiode array, a plurality of subpixel color filters 110 (e.g., 110-G, 110-B, 110-R), a plurality of polarization filters 107, a plurality of shared micro-lenses 115, and a plurality of unshared micro-lenses 117. Components of image sensor 100 are optically aligned to form the plurality of subpixels 103 and plurality of polarization pixels 104 of image sensor 100 for capturing images (e.g., color images, depth map images, video, and the like) while also providing phase detection auto focus.

In some embodiments, the plurality of photodiodes 105 are arranged in a regular, repeating manner such that the plurality of photodiodes 105 are positioned or otherwise disposed within a semiconductor material at regular intervals to form a square or rectangular photodiode array. The individual photodiodes included in the plurality of photodiodes 105 can correspond to doped regions within respective portions of the semiconductor material that are responsive to incident light (e.g., the doped regions can form a PN junction that generates image charge proportional to a magnitude or intensity of the incident light). It is appreciated that the plurality of photodiodes 105 are disposed within the semiconductor material (see, e.g., FIGS. 1B-1C) and can be optically aligned with respective subpixel color filters (e.g. 110-B, 110-G, or 110-R), polarization filters 107, shared micro-lenses 115, unshared micro-lenses 117, or the like to form an individual subpixel 103 included in the plurality of subpixels 103 or an individual polarization pixel 104 included in the plurality polarization pixels 104 for each image pixel of image sensor 100.

Figure 1B:
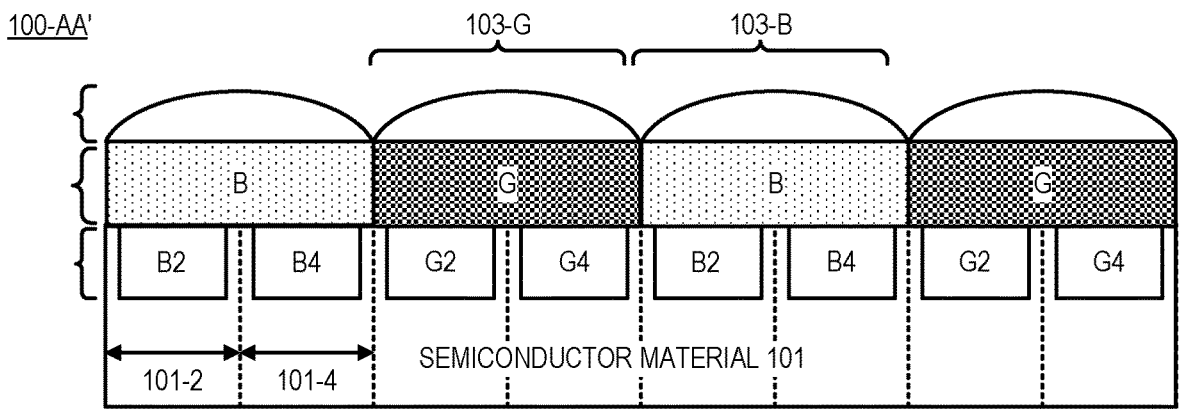
FIGS. 1B-1D illustrate exemplary subpixels and grouped polarization pixels of an imaging system, in accordance with embodiments of the present disclosure.
Figure 1C:
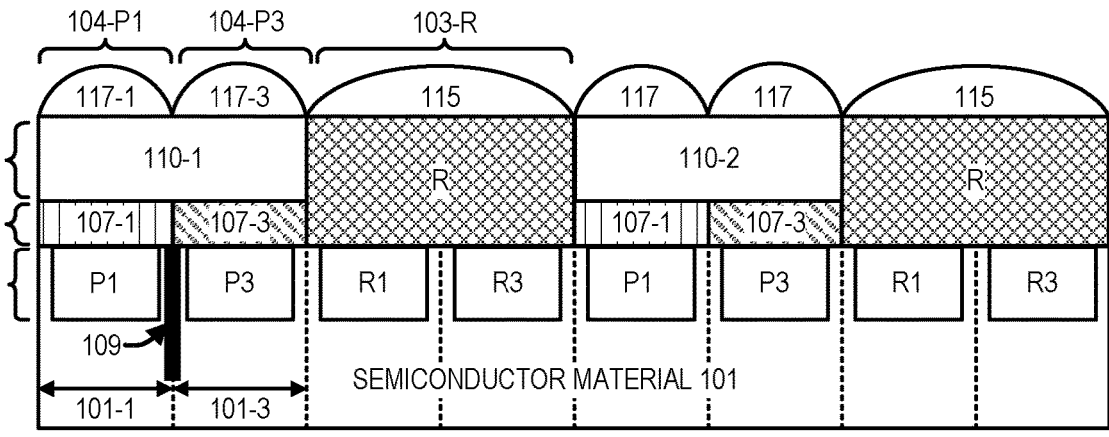

View 100-A illustrated in FIG. 1A generally refers to a given subpixel included in the plurality of subpixels 103 or a given polarization pixel included in the plurality of polarization pixels 104 by the labeled photodiode reference without necessarily showing an exemplary size, shape, or position of the given photodiode. Additionally, view 100-A can omit labels for some elements included in image sensor 100. However, it is noted that exemplary cross-sectional views of image sensor 100 are shown in FIGS. 1B-1C and an exemplary relative size comparison of certain elements is provided in FIG. 1D.

Referring back to FIG. 1A, image pixel 102 is representative of an individual image pixel 102 included in the plurality of image pixels 102 that collectively form image sensor 100. Image pixel 102 includes a plurality of polarization pixels 104 (e.g., P1, P2, P3, P4) and a plurality of subpixels 103 (e.g., a green subpixel 103-G, a blue subpixel 103-B, and a red subpixel 103-R). Each of the plurality of polarization pixels 104 includes an unshared micro-lens 117 optically aligned over a respective photodiode (e.g., the corresponding photodiode associated with P1, P2, P3, or P4) included in the photodiode array (e.g., plurality of photodiodes 105) and a polarization filter 107. At least a subset of the plurality of subpixels 103 include a shared micro-lens 115 optically aligned over a group of photodiodes (e.g., B1, B2, B3, and B4) and a subpixel color filter 110. In the illustrated embodiment, the group of photodiodes associated with a given one of the plurality of subpixels 103 includes four photodiodes collectively arranged in a two-by-two pattern. Thus, a shared micro-lens 110 can extend over two rows and two columns included in the photodiode array to overlie four photodiodes.

In some embodiments, the plurality of polarization pixels 104 are grouped together to cover a similar area as an individual subpixel 103 of the plurality of subpixels 103. In the illustrated embodiment, four polarization pixels included in the plurality of polarization pixels 104 are arranged adjacent to one another in a two-by-two pattern to form a respective group of polarization pixels (e.g., P1, P2, P3, and P4) that is, at least partially, surrounded by the plurality of subpixels 103. More specifically, an image pixel 102 can include three subpixels (e.g., a green subpixel 103-G, a blue subpixel 103-B, and a red subpixel 103-R) complemented with a number of polarization pixels 104 (e.g., a group of polarization pixels that includes P1, P2, P3, and P4) to form a repeat unit of the image sensor 100 (e.g., image pixel 102). In one embodiment, a group of polarization pixels 104 of an image pixel 102 includes four polarization pixels 104 (e.g., the group of polarization pixels located in columns 7-8 and rows 5-6 of FIG. 1A) (as indicated by the symbol "•••" in the drawings) that are collectively surrounded by a first group of the plurality of subpixels 103 (e.g., the subpixels located within columns 5-10 and rows 3-8). The first group of the plurality of subpixels includes four green subpixels 103-G, two blue subpixels 103-B, and two red subpixels 103-R. As illustrated in FIG. 1A, the four green subpixels 103-G are arranged diagonally adjacent to the four polarization pixels while the two blue subpixels 103-B and two red subpixels 103-R are arranged laterally adjacent to the four polarization pixels (e.g., positioned vertically or horizontally of the four polarization pixels when viewed from a top-down perspective as illustrated in FIG. 1A).

As illustrated in FIG. 1A, image pixel 102 is a full color image pixel (e.g., capable of generating image signals in response to incident light that can collectively represent at least the visible portion of the electromagnetic spectrum) and includes a plurality of subpixels (e.g., a red subpixel 103-R, a green subpixel 103-G, and a blue subpixel 103-B). A subpixel 103 can include a corresponding shared micro-lens 115 to direct light through a subpixel color filter 110 towards a respective group of photodiodes included in the photodiode array. In contrast, an unshared micro-lens 117 is unshared with respect to the plurality of photodiodes 105 and thus the unshared micro-lens 117 respectively directs light through a polarization filter 107 toward an individual photodiode 105 to form a corresponding polarization pixel 104. In some embodiments, polarization pixels 104 are grouped together (e.g., in two-by-two groups). As shown in FIG. 1A, there can be spacing and/or a separation distance between individual photodiodes, micro-lenses, and subpixel color filters in accordance with embodiments of the disclosure. Further still, in some embodiments, other components (e.g., vias, wiring, circuitry, isolation trenches, and the like) can be disposed within the spacing.

Each of the micro-lenses (e.g., shared micro-lenses 115 and/or unshared micro-lenses 117) can be formed of a polymer (e.g., polymethylmethacrylate, polydimethylsiloxane, etc.) or other material and be shaped to have optical power for converging, diverging, or otherwise directing light incident upon the micro-lenses through a corresponding optically aligned one of the plurality subpixel color filters 110 and/or polarization filters 107 to a respective one or more photodiodes included in the plurality of photodiodes 105.

As part of forming a full color image pixel, image pixel 102 can include a plurality of subpixel color filters 110 that have a respective spectral photo-response. The term "spectral photo-response" describes the portion of the electromagnetic spectrum that the color filter (e.g., subpixel color filter 110-G, 110-B, 110-R, and the like) transmits. For example, a spectral photo-response corresponding to green (G) indicates that the color filter will transmit a portion of the electromagnetic spectrum corresponding to green light while substantially absorbing or reflecting other portions of the electromagnetic spectrum that do not correspond to green light. Similarly, a spectral photo-response corresponding to panchromatic or wide-band indicates that the color filter substantially transmits a portion of electromagnetic spectrum corresponding to the visible spectrum of light while substantially absorbing or reflecting regions of the electromagnetic spectrum outside of the visible range (e.g., UV, IR, etc., if the photodiode has spectral response outside of the visible range). In some embodiments, the spectral photo-response for blue, green, red, and wide-band subpixel color filters correspond to frequency ranges within the electromagnetic spectrum of approximately 450 nm to 490 nm, 520 nm to 560 nm, 635 nm to 700 nm, and 400 nm to 700 nm, respectively. In some embodiments, the plurality of subpixel color filters 110 included in the plurality of subpixels 103 can have a spectral photo-response corresponding to any one of red, green, blue, panchromatic (e.g., clear or white), yellow, cyan, magenta, or other colors, individually or in combination.

It is appreciated that image sensor 100 can be fabricated by semiconductor device processing and CMOS-compatible microfabrication techniques known by one of ordinary skill in the art. In one embodiment, fabrication of image sensor 100 can include providing a semiconductor material (e.g., a silicon wafer having a front side and a back side), forming a mask or template (e.g., made of cured photo resist) on the front side of the semiconductor material via photolithography to provide a plurality of exposed regions of the front side of semiconductor material, doping (e.g., via ion implantation, chemical vapor deposition, physical vapor deposition, and the like) the exposed portions of the semiconductor material to form the plurality of photodiodes 105 that extend into semiconductor material from the front side of semiconductor material, removing the mask or template (e.g., by dissolving the cured photoresist with a solvent), and planarizing (e.g., via chemical mechanical planarization or polishing) the front side of semiconductor material.

In the same or another embodiment, photolithography can be similarly used to form the plurality of subpixel color filters 110 (e.g., via cured pigmented polymers having a desired spectral photo-response), the plurality of shared micro-lenses 115, the plurality of unshared micro-lenses 117 (e.g., polymer based micro-lenses having a target shape and size formed from a master mold or template), and the plurality of polarization filters (e.g., metal grids or lines structured or otherwise arranged to linearly polarization light to a predetermined degree). It is appreciated that the described techniques are merely demonstrative and not exhaustive and that other techniques can be utilized to fabricate one or more components of image sensor 100.

Figure 2A:
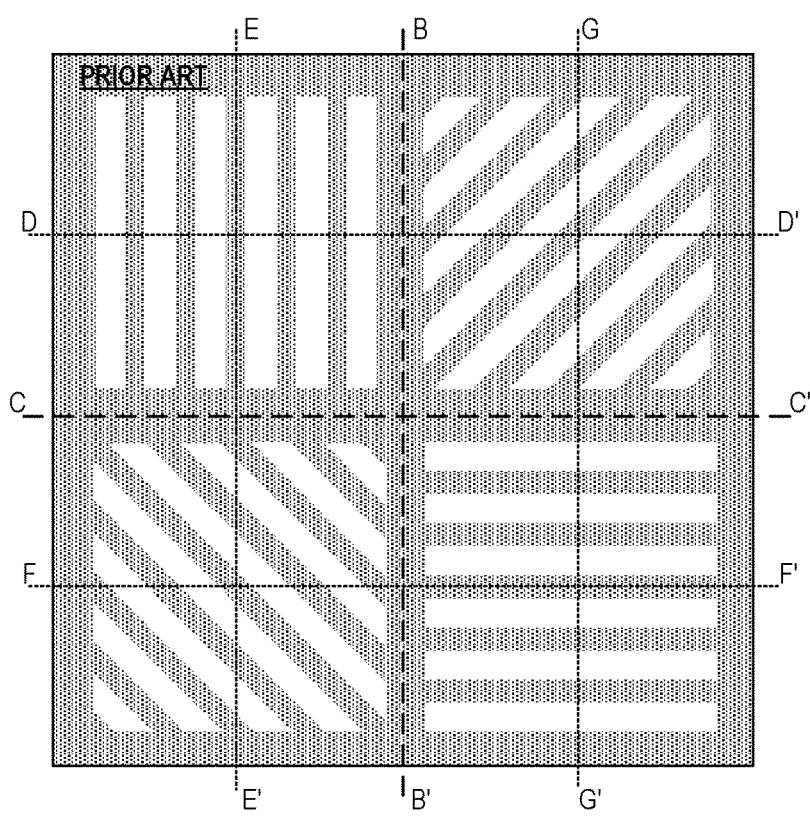
FIG. 2A is a schematic diagram illustrating an asymmetric polarization filter as used in the art.
Figure 2B:
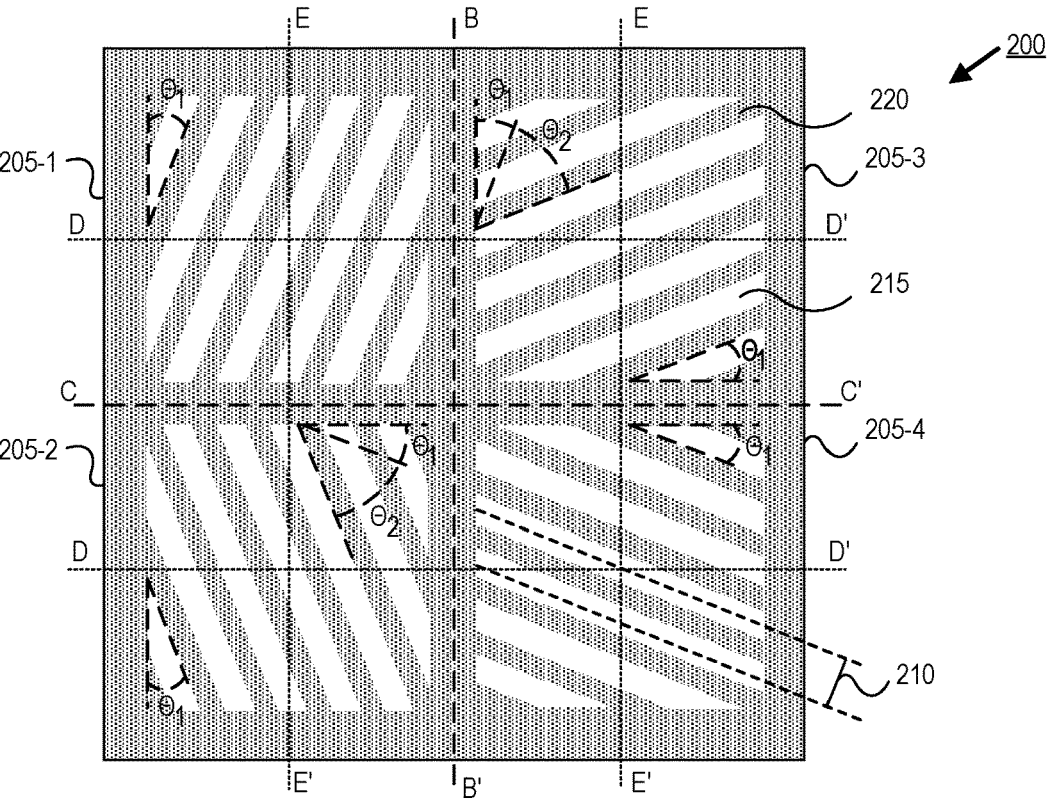
FIG. 2B is a schematic diagram illustrating an example symmetric polarization filter, in accordance with embodiments of the present disclosure.
Figure 3:
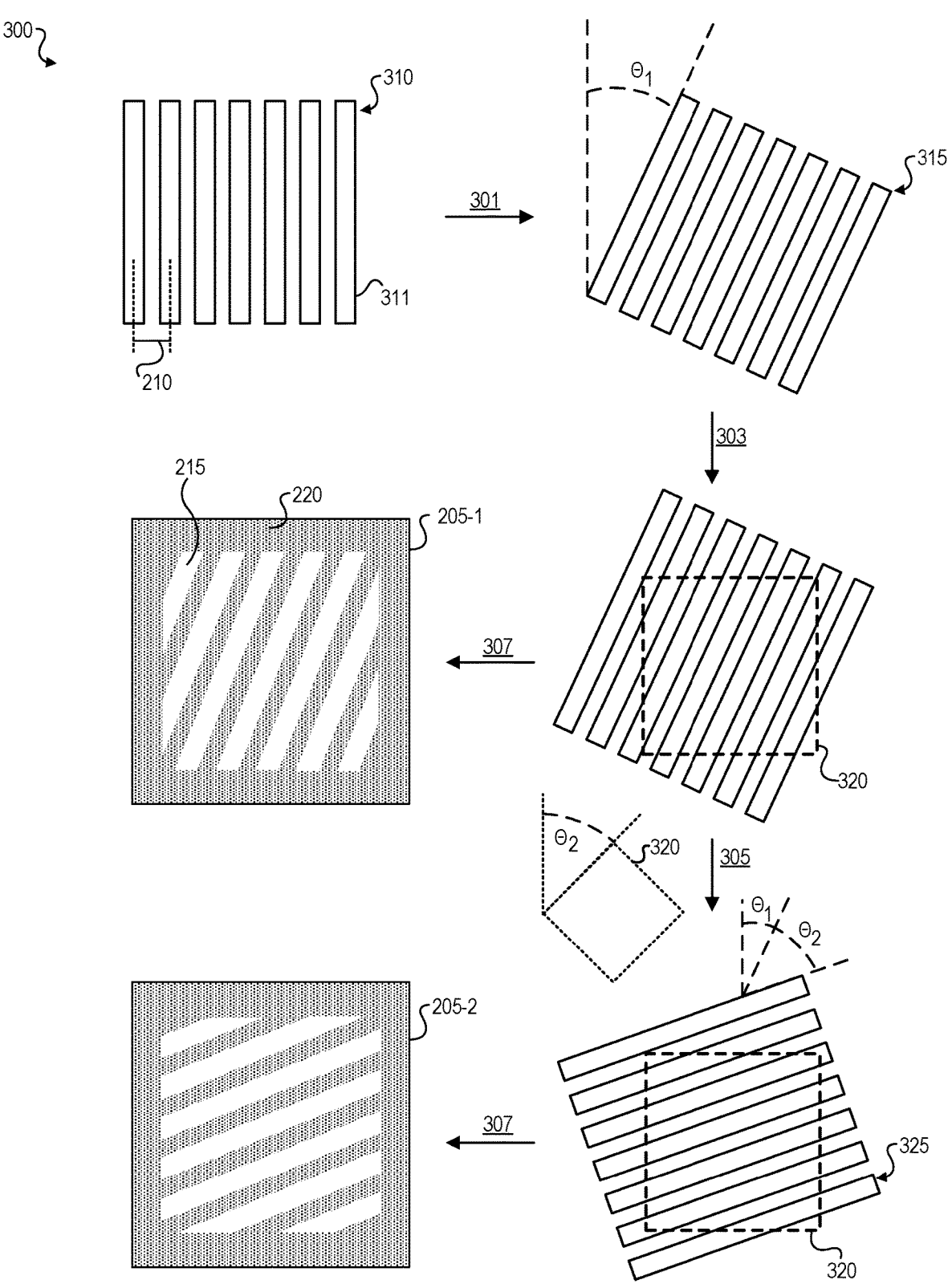
FIG. 3 is a schematic diagram illustrating an example process for defining constituent polarizer elements of the example symmetric polarization filter of FIG. 2B, in accordance with embodiments of the present disclosure.

As described in more detail in reference to FIG. 3, embodiments of the present disclosure relate to an improved polarization pixel 104 configuration that reduces the complexity of fabrication processes. In the context of the semiconductor manufacturing techniques described above, a conventional polarization pixel 104 configuration can include four different polarization filters that are formed by lithographic patterning of a metal film or other medium to define four different polarizers, as described in more detail in reference to FIG. 2A. As such, the conventional polarization configuration includes four separate photo-lithographic operations to define four different polarization filter patterns. In contrast, polarization filters can include four substantially identical polarizers 205 (in reference to FIG. 2B) that are rotated relative to one another, which can be patterned in a single photo-lithographic operation, for example, involving rotation of a semiconductor substrate support platen relative to an optical lithography source (e.g., a patterning laser).

FIG. 1B illustrates a cross-sectional view 100-AA' along line A-A' of image sensor 100 shown in FIG. 1A, in accordance embodiments of the present disclosure. Specifically, the cross-sectional view 100-AA' is along a column of image sensor 100 that includes a plurality of subpixels (e.g., green subpixel 103-G and blue subpixel 103-B) but does not include any polarization pixels 104 as shown in FIG. 1A.

Referring back to FIG. 1B, image sensor 100 includes the plurality of shared micro-lenses 115, the plurality of subpixel color filters 110, and the plurality of photodiodes 105 formed in respective portions of semiconductor material 101 (e.g., silicon). Subpixel color filters 110 (e.g., B for a blue spectral photo-response, G for a green spectral photo-response, and the like) are respectively optically aligned with grouped photodiodes (e.g., B2 and B4) and a shared micro-lens 115 to form a corresponding subpixel included in the plurality of subpixels (e.g., 103-G, 103-B, and the like). Thus, a subpixel color filter 110 is disposed overlying a corresponding group of photodiodes. Similarly, a shared micro-lens 115 is optically aligned with or otherwise disposed overlying a group of photodiodes and a subpixel color filter 110.

Portions of semiconductor material 101 (e.g., 101-2, 101-4, and the like) can be defined to correspond to an individual photodiode 105. It is appreciated that individual photodiodes can extend laterally across a portion of the entire cross-sectional area of the respective portions of semiconductor material 101. In some embodiments, a gap is defined between neighboring photodiodes 105 (e.g., region of semiconductor material 101 between photodiodes B2 and B4), such that additional structures can be formed in the gaps to improve performance of image sensors (e.g., isolation trenches, floating diffusion, and the like).

FIG. 1C illustrates a cross-sectional view 100-BB' along line B-B' of image sensor 100 shown in FIG. 1A, in accordance with embodiments of the present disclosure. Specifically, the cross-sectional view 100-BB' is along a column of image sensor 100 that includes a plurality of subpixels 103 (e.g., red subpixel 103-R, and the like) and a plurality of polarization pixels 104 (e.g., 104-P1, 104-P3, and the like) as shown in FIG. 1A.

Referring back to FIG. 1C, image sensor 100 includes the plurality of shared micro-lenses 115, the plurality of unshared micro-lenses 117, the plurality of subpixel color filters 110 (e.g., R for a red spectral photo-response, and the like), the plurality of polarization filters 107, the plurality of photodiodes 105 disposed in respective portions (e.g., 101-1, 101-3, and the like) of the semiconductor material 101, and an optional deep trench isolation structure 109.

In the illustrated embodiment, a given polarization pixel (e.g., first polarization pixel 104-P1) of an image pixel for image sensor 100 includes a first photodiode (e.g., P1) disposed in a respective portion (e.g., 101-1) of the semiconductor material 101, an unshared micro-lens (e.g., 117-1) optically aligned and/or disposed overlying the first photodiode, and a polarization filter (e.g., 107-1) disposed between the first photodiode and the unshared micro-lens. In some embodiments, polarization filter 107 is configured as a linear polarizer with a linear polarizer patterned, to effect a polarization of light incident upon the polarization filter. Polarization filter 107 can be formed by patterning a metal film disposed overlying semiconductor material 101, for example, between forming photodiodes and disposing color filters 110 and/or micro-lenses 115 and/or 117. As described in more detail in reference to FIG. 2B, separation distance 210 and angle of orientation Θ of a given polarization filter 107 can be configured to impart a linear polarization on incident light. In conventional polarizers, polarizer angle Θ can be 0°, 45°, 90°, or 135°, as described in more detail in reference to FIG. 2A. In some embodiments of the present disclosure, in contrast, polarizer angle Θ can be defined relative to a common axis defined relative to line B-B' as about 22.5° or about −22.5° with multiples of about 45° added for subsequent polarization pixels 104, as described in more detail in reference to FIG. 2B, In some embodiments, polarization pixels 104 are grouped together (e.g., 104-P1 and 104-P3) in a two-by-two pattern (e.g., as shown in FIG. 1A) for a given image pixel. A group of polarization pixels 104 can provide different degrees of linear polarization to incident light. For example, a group of four polarization pixels (e.g., P1, P2, P3, and P4 illustrated in FIG. 1A and partially illustrated in FIG. 1C) arranged in a two-by-two pattern can include polarizer angles to impart a degree of linear polarization of about 22.5°, about 67.5°, about 112.5°, and about 157.5°, respectively.

As shown in FIG. 1C, polarization filters 107 are disposed between the subpixel color filters 110 and photodiodes 105. In some embodiments, subpixel color filters 110 (e.g., 110-1) optically aligned with polarization pixels 107 can exhibit a spectral photo-response corresponding to green or wideband. In some embodiments, polarization pixels 104 can omit a subpixel color filter 110. In some embodiments, the plurality of polarization filters 107 have a negligible thickness such that the thickness of subpixel color filters 110 disposed over the polarization pixels 104 and the plurality of subpixels 103 are substantially equal. Subpixel color filters 110 can be planarized (e.g., by chemical mechanical polishing or other planarizing technique) such that the micro-lenses (e.g., shared micro-lenses 115 and unshared micro-lens 117) are disposed on a surface that substantially planar within allowable tolerances for image sensor applications.

In the illustrated embodiment, image sensor 100 includes deep trench isolation structures 109 (e.g., formed of an oxide within the semiconductor material 101 such as silicon oxide) disposed between adjacent photodiodes (e.g., P1 and P3) included in the plurality of photodiodes 105 that can reduce electrical crosstalk between photodiodes. As illustrated, the deep trench isolation structures 109 extend into the semiconductor material 101 beyond a depth of the plurality of photodiodes 105. Deep trench isolation structures 109 can be omitted in favor of shallow trench isolation structures that extend within the semiconductor material 101 for a portion of the depth of the plurality of photodiodes 105. In some embodiments, isolation structures 109 are omitted for at least a portion of photodiodes 104.

Figure 1D:
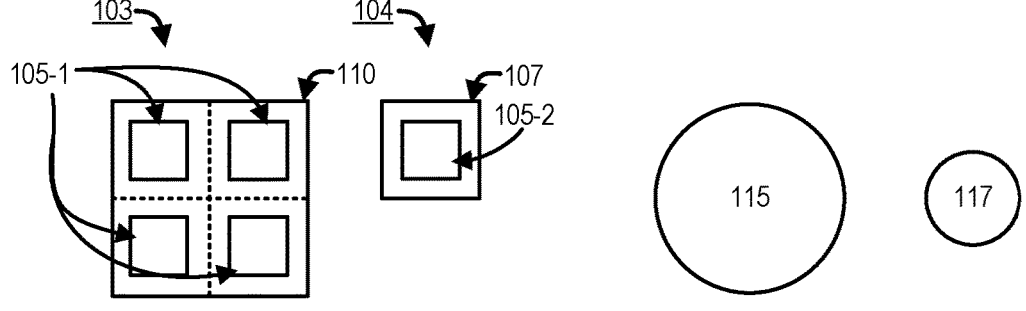

FIG. 1D illustrates a relative size comparison between first subpixel color filter 110, polarization filter 107, shared micro-lens 115, and unshared micro-lens 117 included in an image pixel of image sensor 100 shown in FIGS. 1A-1C, in accordance with embodiments of the present disclosure. Subpixel 103 includes groups of photodiodes 105-1 arranged in a two-by-two pattern of photodiodes that are optically aligned with subpixel color filter 110. Polarization pixel 104 includes photodiode 105-2 optically aligned with polarization filter 107. As illustrated, the shared micro-lens 115 has a first area and the unshared micro-lens 117 has an area less than the first area of the shared micro-lens 115. The subpixel color filter 110 has a third area greater than the first area of the shared micro-lens 115. The polarization filter 107 has a fourth area greater than the second area of the unshared micro-lens 117. The third area of the subpixel color filter 110 is greater than the fourth area of the unshared micro-lens 117. In some embodiments, the relative size comparison between the subpixel color filter 110, the polarization filter 107, the shared micro-lens 115, and the unshared micro-lens 117 of a given subpixel 103 and polarization pixel 104 can be representative of each and every subpixel and/or polarization pixel included in image sensor 100 illustrated in FIGS. 1A-1C.

FIG. 2A is a schematic diagram illustrating an asymmetric polarization filter as used in the conventional art. The asymmetric polarization filter illustrated is labeled as prior art to indicate that the configuration shown is typical for conventional arrangements of polarization pixels 104. As described in reference to FIGS. 1A-1D, the asymmetric polarization filter can be or include a metal layer that has been patterned, for example, by selective deposition and etching of a metal film to form four distinct polarizers. Polarizers in FIG. 2A are defined by quadrants defined by axes B-B' and C-C', such that polarizer BC is found in the upper left, polarizer BC' is found in the upper right, polarizer B'C' is found in the lower right, and polarizer B'C is found in the lower left. The polarizer angles Θ illustrated in FIG. 2A are: for polarizer BC Θ=0°; for polarizer BC' Θ=45°; for polarizer B'C' Θ=90°; for polarizer B'C Θ=135° where Θ is defined as an angle relative to B-B'.

Superimposed on the asymmetric polarization filter are axes D-D', E-E', F-F', and G-G' that serve to indicate mid-lines in each respective polarizer parallel with B-B' or C-C'. For example, E-E' is parallel to B-B' and positioned to serve as the lateral mid-line of polarizer BC and polarizer B'C. Similarly, G-G' is parallel to B-B' and positioned to serve as the lateral mid-line of polarizer BC' and polarizer B'C'. In contrast, D-D' is parallel to C-C' and positioned to serve as the vertical mid-line of polarizer BC and polarizer BC'. Similarly, F-F' is parallel to C-C' and positioned to serve as the vertical mid-line of polarizer B'C' and polarizer B'C.

In FIG. 2A and FIG. 2B, polarizers are shown as shaded regions that define a negative white space of aligned apertures. As opposed to a positive structure, such as a polarization grating, metal-film polarizers transmit light through apertures that are defined by selective deposition and/or removal of metal material according to a pattern. As illustrated in FIG. 2A, conventional asymmetric polarization filters are patterned with opaque metal film material overlying the central region of each polarizer. For example, the central region of polarizer BC is indicated by the intersection of axes D-D' and E-E' overlying metal film material, rather than an aperture. The same can be seen for polarizers BC', B'C', and B'C. Without being limited to a single physical mechanism of operation for photodiodes, quantum efficiency of photocurrent generation (e.g., conversion fraction of incident photons to electrons in doped semiconductor material) is typically highest in the central region. In this way, blocking incident light at and around the central region of a photodiode reduces quantum efficiency and impairs performance of polarization pixels.

Additionally, the number of apertures is defined by the spacing between apertures, such that the number of apertures is a function of polarizer angle Θ and the dimensions and shape of the polarizer. As such, it is seen that the number of apertures is not consistent amongst the polarizers of the asymmetric polarization filter. For example, asymmetric polarization filter defines six apertures for polarizer BC and polarizer B'C' and eight apertures for polarizer BC' and B'C. Similarly, the width of apertures is constrained at least in part by the polarization efficiency. As such, the configuration of the asymmetric polarization filter of FIG. 2A results in polarizers with different numbers of apertures and different transmission area (referring to the aggregate area of apertures). In this way, the transmission of incident light through polarizers of asymmetric polarization filter differs between polarizers BC/B'C' and polarizers B'C/BC' even for perfectly unpolarized incident light. Transmission, in this context, refers to the fraction of incident light that is transmitted through polarizers relative to the total light incident on the polarizers.

Understandably, non-uniform transmission between constituent polarizers of polarization filters can introduce error in PDAF or other signals generated using polarization pixels. For example, the extinction ratio (ER) is an important figure of merit used to characterize linear polarizers. ER is defined as the ratio of the transmission of incident polarized light that is substantially aligned with the polarization angle of a given polarizer to the transmission of incident polarized light that is substantially orthogonal to the polarization angle of a given polarizer. The mathematical expression for extinction ratio is:

$$\rho_P = \frac{T_2}{T_1}$$

where $\rho_p$ is the extinction ratio, $T_1$ is the maximum transmission of the polarizer that occurs when the axis of the polarizer is parallel to the plane of polarization of the incident polarized beam. $T_2$ is the minimum transmission of the polarizer and occurs when the axis of the polarizer is perpendicular to the plane of polarization of the incident polarized beam.

The extinction ratio above is defined for a single polarizer for which transmission T is measured using two different polarized light sources. In some cases, extinction ratio can also be measured for a single light source and two polarizers. In such cases, the extinction ratio depends on the difference in polarization angle between the two polarizers, which, for example, can be used to determine the selectivity of a given polarizer to incident light. In the context of the asymmetric polarization filter of FIG. 2A, ER for different polarizers making up the asymmetric polarization filter also depends at least in part on the area fraction of the apertures, such that different polarizers will exhibit different ER values due at least in part on the different numbers and relative sizes and spacings, of the apertures. Such differences introduce error in PDAF measurements and other processing of signals generated by polarization pixels 104. Such error is typically addressed by sensor calibration or software correction that increases the computational resource demand of autofocus processes and can introduce latency that impairs autofocus performance.

FIG. 2B is a schematic diagram illustrating an example symmetric polarization filter 200, in accordance with embodiments of the present disclosure. Example symmetric polarization filter 200 includes multiple polarizers 205 that can be disposed overlying photodiodes 105 of polarization pixels 104 as described in more detail in reference to FIG. 1C. Polarizers 205 of example symmetric polarization filter 200 include multiple apertures 215 defined in a patterned material 220 separated by a spacing 210. Together, the combination of a photodiode 105 and a polarizer 205, and in some instances a color filter layer 110 and/or a shared micro-lens 115, define a polarization pixel structure 104.

In some embodiments, spacing 210 can be determined based at least in part on the wavelength of incident light, with wider spacings applied to polarize longer wavelengths and shorter spacings applied to polarize shorter wavelengths. As such, spacing 210 can be about 0.1 μm, about 0.2 μm, about 0.3 μm, about 0.4 μm, about 0.5 μm, about 0.6 μm, about 0.7 μm, about 0.8 μm, about 0.9 μm, about 1 μm, about 1.1 μm, about 1.2 μm, about 1.3 μm, about 1.4 μm, about 1.5 μm, about 1.6 μm, about 1.7 μm, about 1.8 μm, about 1.9 μm, about 2.0 μm, or greater, including fractions and interpolations thereof. The number of apertures 215 can be determined by the size of polarization pixels 104, as described previously. With larger polarization pixels 104, more apertures 215 can be defined for a single polarizer 205. Advantageously, larger numbers of apertures 215 improves signal to noise properties, but also increases the size of the sensor. In some embodiments, polarization pixels 104 can be about 0.1 μm², about 0.2 μm², about 0.3 μm², about 0.4 μm², about 0.5 μm², about 0.6 μm², about 0.7 μm², about 0.8 μm², about 0.9 μm², about 1.0 μm², about 2 μm², about 3 μm², about 4 μm², about 5 μm², about 10 μm², about 15 μm², about 20 μm², about 25 μm², about 30 μm², about 35 μm², about 40 μm², about 45 μm², about 50 μm², about 55 μm², about 60 μm², about 65 μm², about 70 μm², about 75 μm², about 80 μm², about 85 μm², about 90 μm², about 95 μm², about 100 μm², about 105 μm², about 110 μm², about 115 μm², about 120 μm², about 125 μm², about 130 μm², about 135 μm², about 140 μm², about 145 μm², about 150 μm², including fractions and interpolations thereof. As such, the number of apertures 215 can be based at least in part on the size of polarization pixel(s) 104 and the wavelength of incident light, with polarizer(s) 205 including about 5 apertures 215, about 10 apertures 215, about 15 apertures 215, about 20 apertures 215, about 25 apertures 215, about 30 apertures 215, about 35 apertures 215, about 40 apertures 215, about 45 apertures 215, about 50 apertures 215, about 55 apertures 215, about 60 apertures 215, about 65 apertures 215, about 70 apertures 215, about 75 apertures 215, about 80 apertures 215, about 85 apertures 215, about 90 apertures 215, about 95 apertures 215, about 100 apertures 215, about 105 apertures 215, about 110 apertures 215, about 115 apertures 215, about 120 apertures 215, about 125 apertures 215, about 130 apertures 215, about 135 apertures 215, about 140 apertures 215, about 145 apertures 215, about 150 apertures 215, including fractions and interpolations thereof.

While illustrated including four polarizers 205, example symmetric polarization filter 200 can include a single polarizer 205, two polarizers 205, three polarizers 205, four polarizers 205, five polarizers 205, six polarizers 205, seven polarizers 205, eight polarizers 205, or more. A polarizer 205 of example symmetric polarization filter 200 is characterized by a polarization angle $\Theta_1$ that is defined relative to a vertical axis of the polarization pixel 104. In the example of symmetric polarization filter 200, the vertical axis corresponds to axis B-B', but it is understood that the term "vertical" is used to indicate a relative alignment rather than an absolute direction.

In contrast to the asymmetric polarization filter of FIG. 2A, example symmetric polarization filter 200 exhibits pattern symmetry across the C-C' axis, such that a first polarizer 205-1 and a third polarizer 205-3, laterally adjacent to each other, are substantially symmetrical to a second polarizer 205-2 and a fourth polarizer 205-4, respectively, which are vertically adjacent to first polarizer 205-1 and third polarizer 205-3, respectively. In this context, symmetry describes a mirror-image reflection about the C-C' axis of the pattern of apertures 215, such that first polarizer 205-1 and second polarizer 205-2 define the same number of apertures 215 that are aligned at substantially the same absolute angle relative to the C-C' axis. As such, the C-C' axis represents a lateral axis of example symmetric polarization filter 200, where a lateral axis is defined as an axis of symmetry of example symmetric polarization 200 filter that is in-plane with the first polarizer and the second polarizer. In-plane, in this context refers to a property of axis C-C' whereby a line defined by two points on C-C' will lie on a plane parallel with a surface of example symmetric polarization filter 200. Example symmetric polarization filter 200 can be a three-dimensional layer, as such the axis C-C' can define a plane through the layer. As such, the plane of axis C-C' can be substantially orthogonal to the surface of example symmetric polarization filter 200.

In this context "substantially" refers to properties of polarizers 205, spacings 210, and/or apertures 215 that are within manufacturing tolerances typical of semiconductor manufacturing processes. As such, apertures 205 that are substantially aligned along a polarization angle refers to apertures being aligned within manufacturing tolerances typical of semiconductor manufacturing processes. It is understood that different semiconductor manufacturing processes can exhibit different tolerances. As such, "substantially" can include a tolerable extent of non-uniformity. Similarly, "substantially symmetrical" can include a tolerable extent of departure from perfect symmetry, as various mechanical, optical, and chemical differences may occur between two different patterning and/or deposition/removal sequences involved in converting a polarizer design into a fabricated polarizer 205 on a semiconductor substrate. Additionally, in this context, "absolute angle" refers to the unsigned magnitude of an angle (e.g., $|\Theta_1|$). Advantageously, the respective polarizers 205 can be patterned at least in part by rotating a semiconductor wafer relative to an optical lithography source using the same pattern 310 (in reference to FIG. 3). In this way, apertures 215 in a given polarizer 205 can be described by two angles, a polarization angle, $\Theta_1$, and a rotated polarization angle, $\Theta_2$, relative to polarization angle $\Theta_1$.

In some embodiments, polarization angle, $\Theta_1$, is defined such that a set of polarizers 205 can be formed without repeating angular orientation as an approach to reduce crosstalk between polarizers 205. For example, while angular orientation can technically be defined between 0 degrees and 360 degrees angles that are separated by 180 degrees perform similarly if not identically. As such, the range of angular orientation can be constrained from a nonzero polarization angle $\Theta_1$ to 180 degrees, relative to the vertical axis B-B'. In this way, polarization angle $\Theta_1$ can be defined at least in part based on the number of polarizers 205 included in a polarization filter. For example, in a polarization filter including four constituent polarizers, as illustrated in FIG. 2B, the magnitude of polarization angle $\Theta_1$ can be about 45 degrees or less, about 40 degrees or less, about 35 degrees or less, about 30 degrees or less, about 25 degrees or less, about 20 degrees or less, about 15 degrees or less, about 10 degrees or less, about five degrees or less, about one degree or less, being greater than zero, including fractions and interpolations thereof. In an illustrative example, polarization angle $\Theta_1$ can be about 22.5° or about −22.5° relative to the B-B' axis. In the example illustrated, $\Theta_1$ can be defined such that a positive angle is defined as a clockwise rotation relative to the B-B' axis. As such, a negative angle can be defined as a counter-clockwise rotation relative to the B-B' axis.

Rotated polarization angle $\Theta_2$, in turn, can be defined such that third polarizer 205-3 is selective relative to first polarizer 205-1 and such that no two polarizers 205 making up a polarization filter are substantially aligned. As such, rotated polarization angle $\Theta_2$ can be based at least in part on the number of polarizers 205 included in the polarization filter. In example polarization filter 200, including four polarizers 205 (e.g., in a 2×2 grouping of two rows and two columns), rotated polarization angle $\Theta_2$ can be about 90 degrees or less, about 85 degrees or less, about 80 degrees or less, about 75 degrees or less, about 70 degrees or less, about 65 degrees or less, about 60 degrees or less, about 55 degrees or less, about 50 degrees or less, about 45 degrees or less, about 40 degrees or less, about 35 degrees or less, about 30 degrees or less, about 25 degrees or less, about 20 degrees or less, about 15 degrees or less, about 10 degrees or less, about five degrees or less, about one degree or less, or less, including fractions and interpolations thereof. In an illustrative example, rotated polarization angle $\Theta_2$ can be about 45° or about −45° relative to a positive clockwise rotation from the B-B' axis. As illustrated, rotated polarization angle $\Theta_2$ can be relative to polarization angle $\Theta_1$ such that total angular orientation of apertures 215 of a given polarizer 205 is the sum of $\Theta_1$ and $\Theta_2$. For example, symmetric polarization filter 200, first polarizer 205 is oriented with a value of $\Theta_1$ of about 22.5 degrees and a value of $\Theta_2$ of about 45 degrees, such that the angular orientation of apertures 215 of third polarizer 205-3, laterally adjacent to first polarizer 205-1, is about 67.5 degrees.

In some embodiments, symmetry across lateral axis (e.g., C-C') reproduces a consistent rotated polarization angle $\Theta_2$ for each subsequent polarizer 205 included in a given polarization filter. In example symmetric polarization filter 200, fourth polarizer 205-4 is rotated by about 90 degrees relative to polarization angle $\Theta_1$ based at least in part on the reflection of the angular rotation of third polarizer 205-3 across lateral axis C-C'. similarly, second polarizer 205-2, vertically adjacent to first polarizer 205-1 and laterally adjacent to fourth polarizer 205-4, is rotated by about 135 degrees relative to $\Theta_1$ and defines an angular orientation, relative to the B-B' axis, of approximately 157.5 degrees.

Such a symmetry condition is found for values of $\Theta_1$ and $\Theta_2$ where $2\Theta_1=\Theta_2$. As such, where a symmetric polarization filter includes more than six polarizers 205 (e.g., in a 2×3 grouping of two rows and three columns), the value of $\Theta_1$ can be about 15 degrees and the value of 02 can be about 30 degrees, such that an upper row of three polarizers 205 can be described by angular orientations of 15 degrees, 45 degrees, and 75 degrees and a lower row, reflected about axis C-C', can be described by angular rotations of 105 degrees, 135 degrees, and 165 degrees. In the exemplary six-polarizer configuration, no two polarizers are described by the same angular orientation and are separated by at least the value of $\Theta_2$. As with example symmetric polarization filter 200, the six-polarizer 205 configuration described above can be formed with a consistent number of apertures 215 and a consistent spacing 210, with each pattern 310 defined with the same optical lithography pattern. Advantageously, processing of symmetric polarization filters can be less complex than asymmetric polarization filters, which include at least two different patterns and four orientations.

As previously described, the extinction ratio of polarizer 205 describes the selectivity of polarizer 205 to transmit angular components of incident light that are aligned with the angular orientation of polarizer 205 and to attenuate angular components of incident light different from the angular orientation of polarizer 205. In contrast to the conventional asymmetric polarization filter of FIG. 2A, example symmetric polarization filter 200 of FIG. 2B includes four substantially identical, albeit rotated and/or reflected, polarizers 205. In this way, the extinction ratio for each constituent polarizer 205 of example symmetric polarization filter 200 can be substantially equal. Advantageously, providing example symmetric polarization filter 200 with substantially equal ER values for each polarizer 205 improves performance and reduces error in PDAF and other measures relative to asymmetric polarization filters conventionally used.

FIG. 3 is a schematic diagram illustrating an example process 300 for defining constituent polarizer 200 elements of the example symmetric polarization filter 200 of FIG. 2B, in accordance with embodiments of the present disclosure. Example process 300 is illustrated with exemplary angular rotations $\Theta_1$ and $\Theta_2$ of a pattern 310, where pattern elements 311 represent positives of apertures 215 to be defined in an opaque filter material 220 (e.g., metal wires). Constituent operations 301-307 of example process 300 are described in functional terms, but it is understood that each operation can include one or more suboperations implemented as part designing and fabricating a polarizer 205, as described in more detail in reference to FIGS. 1A-1C. As would be understood by a person having ordinary skill in the art, the order of operations 301-307 can be partly sequential and partly parallel, as some CMOS processes are localized to precise regions of a substrate surface, while others are applied uniformly over broad regions of the substrate surface.

At operation 301, aperture pattern 310 is rotated by polarization angle $\Theta_1$ to define rotated pattern 315. In contrast to asymmetric polarization filter of FIG. 2A, rotation of the pattern 310 can be applied successively to define each polarizer 205 of example symmetric polarization filter 200. In this way, pattern 310, which is transferred to a semiconductor substrate by optical lithographic techniques, can be used to define multiple polarization pixels 104, instead of using multiple different patterns as is conventional in the art. As previously described, using multiple different patterns introduces nonuniformity in transmission characteristics and extinction coefficients of different polarization pixels 104 and can act as a source of error in PDAF calculations.

At operation 303, aperture frame 320 is applied to rotated pattern 310 to define apertures 215 of first polarizer 205-1. As described in more detail in reference to FIG. 2B, first polarizer 205-1 includes apertures 215 separated (offset) by spacing 210, defined in filter material 220. Aperture frame 320 can be a different size than fabricated first polarizer 205-1, based at least in part on fabrication processes that transfer a micropattern from a design onto the semiconductor substrate of image sensor 100.

At operation 305, rotated pattern 315 is further rotated $\Theta_2$ to redefine rotated pattern 315. As illustrated, pattern 310, rotated pattern 315, and redefined rotated pattern 325 are identical, save for the angular orientation of pattern elements 311 relative to a vertical axis (e.g., aligned with B-B' of FIG. 2B). For example, pattern elements 311 of pattern 310 are aligned substantially parallel with the vertical, while elements 311 of rotated pattern 315 are aligned substantially parallel with $\Theta_1$ and elements 311 of redefined rotated pattern 325 are aligned substantially with the angle defined by the sum of $\Theta_1$ and $\Theta_2$. In some embodiments, operation 307 can optionally proceed by rotating aperture frame 320, rather than rotated pattern 315. For example, aperture frame 320 can be rotated by $\Theta_2$ to define third polarizer 205-3, rather than by further rotating rotated pattern 315.

In some embodiments, second polarizer 205-2 and fourth polarizer 205-4 are defined by mirror-reflection of third polarizer 205-3 and first polarizer 205-1, respectively, across a lateral axis (e.g., axis C-C'). in some embodiments, second polarizer 205-2 and fourth polarizer 205-4 are defined by repeated instances of operation 305 (e.g., rotating pattern 315 by successive increments of $\Theta_2$). In this way, example process 300 permits an arbitrary number of polarizers 205 to be defined using a single pattern 310. In the context of the conventional four-polarizer 205 design, example process 300 provides improved performance characteristics by providing four polarizers 205 with substantially identical extinction coefficients and transmission values.

At operation 307, patterns defined by aperture frame 320 are transferred onto image sensor as part of fabricating polarizers 205. As would be understood by a person of ordinary skill in the art, operation 307 can include multiple suboperations for depositing a film formed of opaque filter material 220, depositing a photoresist layer overlying the opaque filter material 220, patterning the photoresist layer in accordance with pattern 310, and selectively removing the opaque filter material 220 to define apertures 215. In an illustrative example, opaque filter material 220 can be or include a metal that can be deposited overlying photodiodes 105 in a uniform layer, as by physical vapor deposition or other thin film deposition techniques. Opaque filter material can be patterned by lithographic patterning and subsequent deposition/etch processes to define polarizers 205, in accordance with the patterns 315 and 325.

Figure 4:
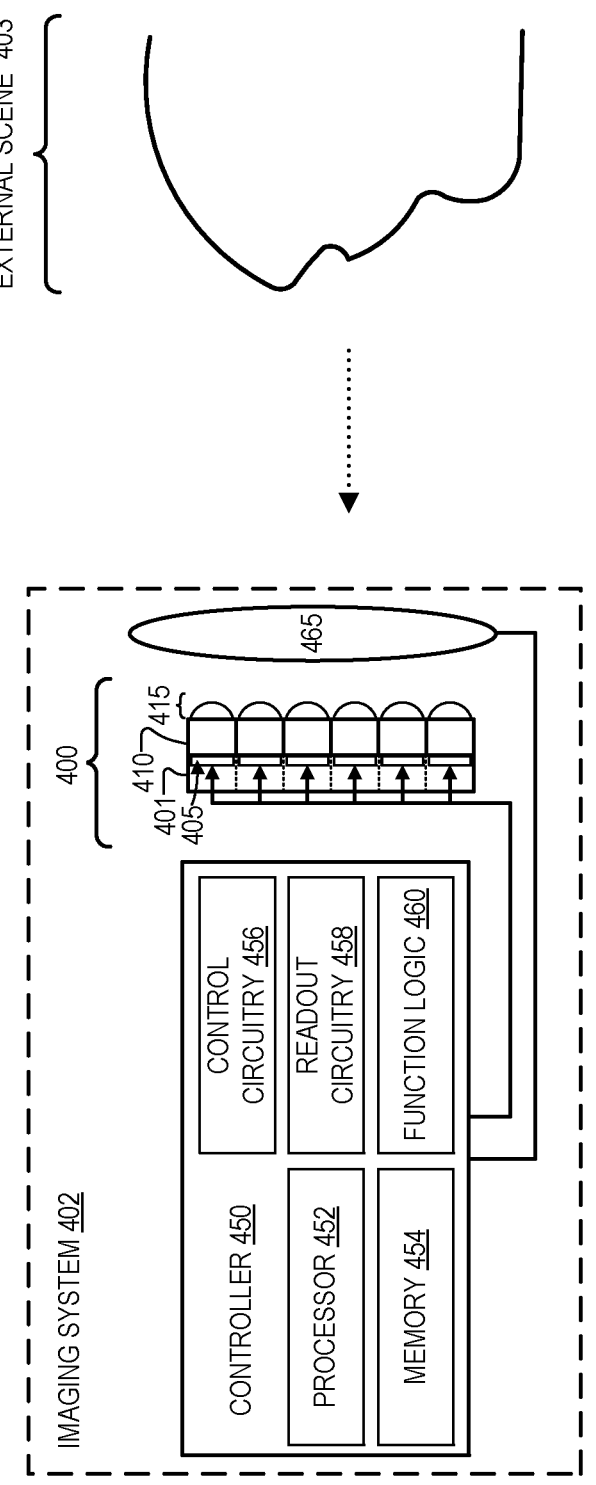
FIG. 4 is a functional block diagram of an imaging system including an image sensor with polarization pixels implementing a symmetrical polarization filter described in an exemplary embodiment in FIGS. 2B-3, in accordance with embodiments of the present disclosure.

FIG. 4 is a functional block diagram of an imaging system 402 including an image sensor 400 with polarization pixels 104 implementing a symmetrical polarization filter described in an exemplary embodiment in FIGS. 2B-3, in accordance with embodiments of the present disclosure. The image sensor 400 can have a structure corresponding to image sensor 100 illustrated in FIGS. 1A-1D, with example symmetrical polarization filter 200 as described in more detail in reference FIG. 2B. The imaging system 402 includes image sensor 400 to generate electrical or image signals in response to incident light 470, objective lens(es) 465 with adjustable optical power to focus on one or more points of interest within the external scene 403, and controller 450 to control, inter alia, operation of image sensor 400 and objective lens(es) 465. Image sensor 400 is one possible implementation of image sensor 100 illustrated in FIGS. 1A-1B. Image sensor 400 is a simplified schematic showing a semiconductor material 401 with a plurality of photodiodes 405 disposed within respective portions of the semiconductor material 401, a plurality of color filters 410, and a plurality of micro-lenses 415. The controller 450 includes one or more processors 452, memory 454, control circuitry 456, readout circuitry 458, and function logic 460.

The controller 450 includes logic and/or circuitry to control the operation (e.g., during pre-, post-, and in situ phases of image and/or video acquisition) of the various components of imaging system 402. The controller 450 can be implemented as hardware logic (e.g., application specific integrated circuits, field programmable gate arrays, system-on-chip, etc.), software/firmware logic executed on a general purpose microcontroller or microprocessor, or a combination of both hardware and software/firmware logic. In one embodiment, the controller 450 includes the processor 452 coupled to memory 454 that stores instructions for execution by the controller 450 and/or one or more other components of the imaging system 402. The instructions, when executed, can cause the imaging system 402 to perform operations associated with the various functional modules, logic blocks, or circuitry of the imaging system 402 including any one of, or a combination of, the control circuitry 456, the readout circuitry 458, the function logic 460, image sensor 400, objective lens 465, and any other element of imaging system 402 (illustrated or otherwise). The memory is a non-transitory computer-readable medium that can include, without limitation, a volatile (e.g., RAM) or non-volatile (e.g., ROM) storage system readable by controller 450. It is further appreciated that the controller 450 can be a monolithic integrated circuit, one or more discrete interconnected electrical components, or a combination thereof. Additionally, in some embodiments one or more electrical components can be coupled together to collectively function as controller 450 for orchestrating operation of the imaging system 502.

Control circuitry 456 can control operational characteristics of the photodiode array 405 (e.g., exposure duration, when to capture digital images or videos, and the like). Readout circuitry 458 reads or otherwise samples the analog signal from the individual photodiodes (e.g., read out electrical signals generated by each of the plurality of photodiodes 405 in response to incident light to generate image signals for capturing an image frame, and the like) and include amplification circuitry, analog-to-digital (ADC) circuitry, image buffers, or otherwise. In the illustrated embodiment, readout circuitry 458 is included in controller 450, but in other embodiments readout circuitry 458 can be separate from the controller 450. Function logic 460 is coupled to the readout circuitry 458 to receive image data to demosaic the image data and generate one or more image frames. In some embodiments, the electrical signals and/or image data can be manipulated or otherwise processed by the function logic 460 (e.g., apply post image effects such as crop, rotate, remove red eye, adjust brightness, adjust contrast, or otherwise).

In the context of phase-detection autofocus (PDAF) operations, PDAF describes a technique for generating an autofocus control signal based at least in part on a phase mismatch between two image signals generated by an image sensor. The magnitude and polarity of the phase mismatch can be used to generate a control signal to adjust the focal distance of a lens relative to the image sensor. Phase mismatch refers to a difference signal between two or more virtual images formed by under-focusing or over-focusing, which is a function of the focal distance of an objective lens relative to a sensor surface. The format and magnitude of the control signal is based at least in part on the hardware configuration of imaging system 402, the types of servos and/or motors included to drive objective lens 465 or other lenses. In an illustrative example, where a phase-mismatch signal indicates that images are under-focused, a PDAF signal can be generated to bring the focal distance onto image sensor 400 and/or to generate visualization data to indicate an under-focused state.

The phase mismatch signal can be determined by the difference in photocurrent signals generated by paired polarization pixels of opposing alignments. For example, phase mismatch can be determined using a L-R difference signal, an U-D difference signal, or a L-R/U-D difference-sum signal that combines both L-R and U-D to boost the signal intensity as an approach to improving precision and reducing oversensitivity of PDAF auto-focus processes. In some embodiments, L-R or U-D difference signals are generated by summing signals from photodiodes on each respective side of directional boundary. For example, a L-R difference signal can be generated by summing signals from photodiodes including first polarizer 205-1 and fourth polarizer 205-4, summing signals from photodiodes including second polarizer 205-2 and third polarizer 205-3, and finding the difference of the two sum signals.

Using the L-R or the U-D difference signal permits the phase mismatch signal to be generated more quickly at a cost to the accuracy and sensitivity of the phase mismatch signal. In some embodiments, a first group of polarization pixels 104 is configured to generate the L-R difference signal and a second group of polarization pixels 104 is configured to generate the U-D difference signal. In this way, both L-R and U-D difference signals can be generated in the same sensor cycle, such that the L-R/U-D difference-sum signal can be generated (e.g., using neighboring pixel structures), rather than multiple sensor cycles.

Reference throughout this specification to "one example" or "one embodiment" means that a particular feature, structure, or characteristic described in connection with the embodiment is included in at least one embodiment of the present invention. Thus, the appearances of the phrases "in one example" or "one embodiment" in various places throughout this specification are not necessarily all referring to the same embodiment. Furthermore, the particular features, structures, or characteristics can be combined in any suitable manner in one or more embodiments.

Spatially relative terms, such as "beneath," "below," "over," "under," "above," "upper," "top," "bottom," "left,"

"right," "center," "middle," and the like, can be used herein for ease of description to describe one element or feature's relationship relative to another element(s) or feature(s) as illustrated in the figures. It will be understood that the spatially relative terms are intended to encompass different orientations of the device in use or operation in addition to the orientation depicted in the figures. For example, if the device in the figures is rotated or turned over, elements described as "below" or "beneath" or "under" other elements or features would then be oriented "above" the other elements or features. Thus, the exemplary terms "below" and "under" can encompass both an orientation of above and below. The device can be otherwise oriented (rotated ninety degrees or at other orientations) and the spatially relative descriptors used herein are interpreted accordingly. In addition, it will also be understood that when an element is referred to as being "between" two other elements, it can be the only element between the two other elements, or one or more intervening elements can also be present.

Throughout this specification, several terms of art are used. These terms are to take on their ordinary meaning in the art from which they come, unless specifically defined herein or the context of their use would clearly suggest otherwise. It should be noted that element names and symbols can be used interchangeably through this document (e.g., Si vs. silicon); however, both have identical meaning.

The processes explained above can be implemented using software and/or hardware. The techniques described can constitute machine-executable instructions embodied within a tangible or non-transitory machine (e.g., computer) readable storage medium, that when executed by a machine (e.g., controller 450 of FIG. 4) will cause the machine to perform the operations described. Additionally, the processes can be embodied within hardware, such as an application specific integrated circuit ("ASIC"), field programmable gate array (FPGA), or otherwise.

A tangible machine-readable storage medium includes any mechanism that provides (i.e., stores) information in a non-transitory form accessible by a machine (e.g., a computer, network device, personal digital assistant, manufacturing tool, any device with a set of one or more processors, etc.). For example, a machine-readable storage medium includes recordable/non-recordable media (e.g., read only memory (ROM), random access memory (RAM), magnetic disk storage media, optical storage media, flash memory devices, etc.).

The above description of illustrated examples of the invention, including what is described in the Abstract, is not intended to be exhaustive or to limit the invention to the precise forms disclosed. While specific examples of the invention are described herein for illustrative purposes, various modifications are possible within the scope of the invention, as those skilled in the relevant art will recognize.

These modifications can be made to the invention in light of the above detailed description. The terms used in the following claims should not be construed to limit the invention to the specific examples disclosed in the specification. Rather, the scope of the invention is to be determined entirely by the following claims, which are to be construed in accordance with established doctrines of claim interpretation.

What is claimed is:

1. A symmetric polarization filter, comprising:
a first polarizer defining a first plurality of apertures; and
a second polarizer, adjacent with the first polarizer, defining a second plurality of apertures, wherein the first plurality of apertures is mirror symmetrical with the second plurality of apertures about a lateral axis of the symmetric polarization filter between the first polarizer and the second polarizer, wherein the lateral axis is defined as an axis of symmetry of the symmetric polarization filter, wherein the axis of symmetry is:
in plane with the first polarizer and the second polarizer, and configured through a center point of the entire symmetric polarization filter,
wherein the center point is configured at an equal distance from opposite edges of the symmetric polarization filter,
and wherein the lateral axis is the axis of symmetry common to the mirror symmetry between the pluralities of apertures of the laterally adjacent polarizers across the axis of symmetry of the symmetric polarization filter for all polarizers of the filter.

2. The symmetric polarization filter of claim 1, wherein:
the first polarizer is characterized by a first extinction ratio;
the second polarizer is characterized by a second extinction ratio; and
the first extinction ratio and the second extinction ratio are substantially equal.

3. The symmetric polarization filter of claim 1, wherein:
the first polarizer is disposed overlying a first photodiode of an image sensor;
the second polarizer is disposed overlying a second photodiode of the image sensor;
the first plurality of apertures overly a first portion of the first photodiode;
the second plurality of apertures overly a second portion of the second photodiode; and
the first portion and the second portion are substantially equal in area.

4. The symmetric polarization filter of claim 1, wherein a first aperture of the first plurality of apertures overlies a first center of the first polarizer.

5. The symmetric polarization filter of claim 1, wherein two apertures of the first plurality of apertures are offset by a spacing and are substantially aligned along a nonzero polarization angle relative to a vertical axis of the symmetric polarization filter, the vertical axis being orthogonal to the lateral axis.

6. The symmetric polarization filter of claim 5, wherein the polarization angle is about 22.5 degrees relative to a positive clockwise rotation of the vertical axis.

7. The symmetric polarization filter of claim 5, further comprising:
a third polarizer, laterally adjacent with the first polarizer, and defining a third plurality of apertures offset by the spacing and substantially aligned at an angular orientation different from the polarization angle.

8. The symmetric polarization filter of claim 7, wherein the angular orientation comprises a rotated polarization angle of about 45 degrees or about-45 degrees relative to the polarization angle.

9. The symmetric polarization filter of claim 7, further comprising:
a fourth polarizer, diagonally adjacent to the first polarizer, vertically adjacent to the third polarizer, and laterally adjacent to the second polarizer, defining a fourth plurality of apertures separated by the spacing and mirror-symmetrical about the lateral axis with the third plurality of apertures of the third polarizer.

10. An imaging system, comprising:

an image sensor including a plurality of photodiodes arranged as a photodiode array, the plurality of photodiodes disposed on a substrate to form a plurality of polarization pixels, including:

a symmetric polarization filter, comprising:

a first polarizer defining a first plurality of apertures; and a second polarizer, adjacent with the first polarizer, defining a second plurality of apertures, wherein the first plurality of apertures is mirror symmetrical with the second plurality of apertures about a lateral axis of the symmetric polarization filter between the first polarizer and the second polarizer, wherein the lateral axis is defined as an axis of symmetry of the symmetric polarization filter, wherein the axis of symmetry is:

in plane with the first polarizer and the second polarizer, and configured through a center point of the entire symmetric polarization filter, wherein the center point is configured at an equal distance from opposite edges of the symmetric polarization filter, and wherein the lateral axis is the axis of symmetry common to the mirror symmetry between the pluralities of apertures of the laterally adjacent polarizers across the axis of symmetry of the symmetric polarization filter for all polarizers of the filter.

11. The imaging system of claim 10, wherein:

the first polarizer is characterized by a first extinction ratio;

the second polarizer is characterized by a second extinction ratio; and the first extinction ratio and the second extinction ratio are substantially equal in area.

12. The imaging system of claim 10, wherein:

the first polarizer is disposed overlying a first photodiode of the plurality of photodiodes;

the second polarizer is disposed overlying a second photodiode of the plurality of photodiodes;

the first plurality of apertures overly a first portion of the first photodiode;

the second plurality of apertures overly a second portion of the second photodiode; and the first portion and the second portion are substantially equal.

13. The imaging system of claim 10, wherein a first aperture of the first plurality of apertures overlies a first center of the first polarizer and wherein a second aperture of the second plurality of apertures overlies a second center of the second polarizer.

14. The imaging system of claim 10, further comprising:

a controller coupled with the image sensor and logic that when executed by the controller causes the imaging system to perform operations including:

reading out an electrical signal generated in response to incident light, the electrical signal generated by the plurality of photodiodes.

15. The imaging system of claim 14, further comprising additional logic that when executed by the controller causes the imaging system to perform further operations including:

determining a focus state for the imaging system based at least in part on the electrical signal as part of phase-detection auto focus (PDAF).

16. The imaging system of claim 10, wherein two apertures of the first plurality of apertures are offset by a spacing and are substantially aligned along a nonzero polarization angle relative to a vertical axis of the symmetric polarization filter orthogonal to the lateral axis.

17. The imaging system of claim 16, wherein the polarization angle is about 22.5 degrees relative to a positive clockwise rotation of the vertical axis.

18. The imaging system of claim 16, further comprising:

a third polarizer, laterally adjacent with the first polarizer, and defining a third plurality of apertures offset by the spacing and substantially aligned at an angular orientation different from the polarization angle.

19. The imaging system of claim 18, wherein the angular orientation comprises a rotated polarization angle of about 45 degrees or about-45 degrees relative to the polarization angle.

20. The imaging system of claim 18, further comprising:

a fourth polarizer diagonally adjacent to the first polarizer, vertically adjacent to the third polarizer, and laterally adjacent to the second polarizer, defining a fourth plurality of apertures separated by the spacing and mirror-symmetrical about the lateral axis with the third plurality of apertures of the third polarizer.

21. An image sensor, comprising a plurality of image pixels, each image pixel comprising a plurality of subpixels and one or more groups of polarization pixels, wherein:

the plurality of subpixels comprising at least one blue subpixel, at least one green subpixel, and at least one red subpixel, each subpixel of the plurality of subpixels being laterally or diagonally adjacent to one group of the one or more groups of polarization pixels, and each group of the one or more groups of polarization pixels comprises:

a first polarization pixel and a second polarization pixel, and a symmetric polarization filter, comprising:

a first polarizer defining a first plurality of apertures, the first polarizer being disposed over the first polarization pixel; and a second polarizer, laterally adjacent with the first polarizer, defining a second plurality of apertures, the second polarizer being disposed over the second polarization pixel, wherein the first plurality of apertures is mirror symmetrical with the second plurality of apertures about a lateral axis of the symmetric polarization filter between the first polarizer and the second polarizer, wherein the lateral axis is defined as an axis of symmetry of the symmetric polarization filter, wherein the axis of symmetry is in plane with the first polarizer and the second polarizer and is configured through a center point of the entire symmetric polarization filter, wherein the center point is configured at an equal distance from opposite edges of the symmetric polarization filter, and wherein the lateral axis is the axis of symmetry common to the mirror symmetry between the pluralities of apertures of the laterally adjacent polarizers across the axis of symmetry of the symmetric polarization filter for all polarizers of the filter.

* * * * *